United States Patent
Yang

(10) Patent No.: US 6,958,250 B2
(45) Date of Patent: Oct. 25, 2005

(54) LIGHT-EMITTING DIODE ENCAPSULATION MATERIAL AND MANUFACTURING PROCESS

(76) Inventor: Yung-Shu Yang, P.O. Box No. 6-57, Junghe, Taipei 235 (TW)

( * ) Notice: Subject to any disclaimer, the term of this patent is extended or adjusted under 35 U.S.C. 154(b) by 0 days.

(21) Appl. No.: 10/716,624

(22) Filed: Nov. 20, 2003

(65) Prior Publication Data

US 2005/0048681 A1   Mar. 3, 2005

(30) Foreign Application Priority Data

Aug. 26, 2003   (TW) ............... 92123504 A

(51) Int. Cl.$^7$ ............... H01L 21/00; H01L 33/00
(52) U.S. Cl. ............... 438/22; 257/99
(58) Field of Search ............... 257/99, 100; 438/22

(56) References Cited

U.S. PATENT DOCUMENTS

| | | | |
|---|---|---|---|
| 4,317,862 A | * | 3/1982 | Honda et al. ............... 428/442 |
| 6,018,167 A | * | 1/2000 | Oota ............... 257/99 |
| 6,114,090 A | * | 9/2000 | Wu et al. ............... 430/281.1 |
| 2001/0026011 A1 | * | 10/2001 | Roberts et al. ............... 257/678 |

* cited by examiner

Primary Examiner—Minhloan Tran
Assistant Examiner—Thomas L. Dickey
(74) Attorney, Agent, or Firm—Troxell Law Office, PLLC

(57) ABSTRACT

A light-emitting diode (LED) encapsulation material and manufacturing process comprising a photo-sensitive polymer constituting at least one of an Oligomer or a reactive Monomer, and a Photoinitiator. After a LED chip encapsulation, the photo-sensitive polymer is exposed to visible light or ultraviolet light, or electron beam, free of infrared rays, thereby triggering a free radical polymerization reaction of the photo-sensitive polymer, and rapid curing thereof under room temperature, eliminating the need for heating in a furnace during encapsulation manufacturing process of the light-emitting diode, while prompting rapid curing thereof, and thereby enhancing production efficiency.

7 Claims, 3 Drawing Sheets

LIGHT-EMITTING DIODE ENCAPSULATION MATERIAL AND MANUFACTURING PROCESS

BACKGROUND OF THE INVENTION (a) Field of the Invention

The present invention primarily relates to an application of encapsulation material and manufacturing processes of a light-emitting diode (LED), eliminating the need for heating in a furnace during encapsulation manufacturing process of the light-emitting diode, prompting rapid curing thereof, and thereby enhancing production efficiency.

(b) Description of the Prior Art

Referring to FIG. 1, which shows a manufacturing process of a traditional light-emitting diode (LED), whereby the manufacturing process is divided into the following steps:

1, Die Bonding: The light-emitting diode chip is placed and bonded onto a pre-punched first leadframe.

2, Soldering: A metal lead is made to connect the light-emitting diode chips and a second lead stand thereby allowing conductance therethrough, enabling the first leadframe, a second leadframe, and the light-emitting diode chips to form an electrical link thereof.

3, Encapsulation: Upon injecting a thick, viscous, fluid epoxy resin into a mold, place the light-emitting diode chips, the first leadframe and the second leadframe into the mold.

4, Baking: Upon encapsulation, place encapsulant material into a heating furnace and heat at a high temperature. After 3 to 8 hours the thick, viscous fluid high molecule weight resin will have hardened, thereby completing encapsulation.

5, Cutting, testing and packaging.

Third step and fourth step of the aforementioned manufacturing process are steps involved in conventional "encapsulation". An epoxy resin is a principle component of encapsulating "high molecule weight resin" material, whereby the epoxy resin is used as the encapsulation material of the light-emitting diode, primarily because the epoxy resin has properties of high transparency, high heat resistance, high thermal conductivity, resistance to humidity, and resistance to corrosion, features wherewith conform to light-emitting diode requirements of applicable environment and functionality.

The most universal epoxy resin utilized as the encapsulation material for the light-emitting diode is a thermosetting epoxy resin, which, before curing, is in a form of a fluid, sticky viscous liquid or a semi-gelatinous colloid. Upon adding a curing agent, and after baking at a high temperature for 3 to 8 hours will harden, thereby forming a cross-linked, solid polymer.

Furthermore, because of an enormous discrepancy between thermal expansion coefficients of the epoxy resin and the LED chips, during process of curing, cooling and shrinkage of the epoxy resin, internal stress may occur between the epoxy resin and the LED chips, engendering cracking of the epoxy resin, fracturing of the LED chips, separation of adhesion, shifting or splitting of component connected Leadframes, etc.

From the aforementioned integral manufacturing process of the light-emitting diode, wherein an extremely long time is spent in encapsulation of the epoxy resin and heat baking, furthermore, component formulation is complicated, and thus results in an inability to increase speed of producing the light-emitting diode, resulting in inefficient production. Therefore, there is a need for perfecting the manufacturing process.

SUMMARY OF THE INVENTION

Specifically, the present invention provides encapsulation material and manufacturing processes of a light-emitting diode, wherein comprises a photo-sensitive polymer constituting at least one of an Oligomer or a reactive Monomer, and a Photoinitiator. After a LED chip encapsulation, the photo-sensitive polymer is exposed to visible light or ultraviolet light irradiation, or electron beam, free of infrared rays, thereby triggering a free radical polymerization reaction of the fluid photo-sensitive polymer, and rapid curing thereof under room temperature, eliminating the need for baking during encapsulation manufacturing process of the light-emitting diode, while prompting rapid curing thereof, and thereby enhancing production efficiency.

Another objective of the present invention is to provide encapsulation material and manufacturing processes of the light-emitting diode wherein comprises the photo-sensitive polymer constituting at least one of an Oligomer or a reactive Monomer. After a LED chip encapsulation, irradiation with an electron beam is carried out, whereby electron bombardment is utilized to accomplish amalgamation of material molecules, thereby triggering free radical polymerization reaction of the fluid photo-sensitive polymer, and rapid curing thereof under room temperature, eliminating the need for baking during encapsulation manufacturing process of the light-emitting diode, while prompting rapid curing thereof, and thereby enhancing production efficiency.

Furthermore, when implementing the present invention, a Silane coupling agent may be added to the encapsulant material, thereby increasing the bonding strength among between the materials; an ultraviolet absorber may be added to increase resistance against ultraviolet light degradation; a Hindered Amine Light Stabilizer may be added to avoid free radical chemistry structure destruction.

As for the preferred embodiment of the present invention, a detailed description and a fuller understanding can be had hereinafter:

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
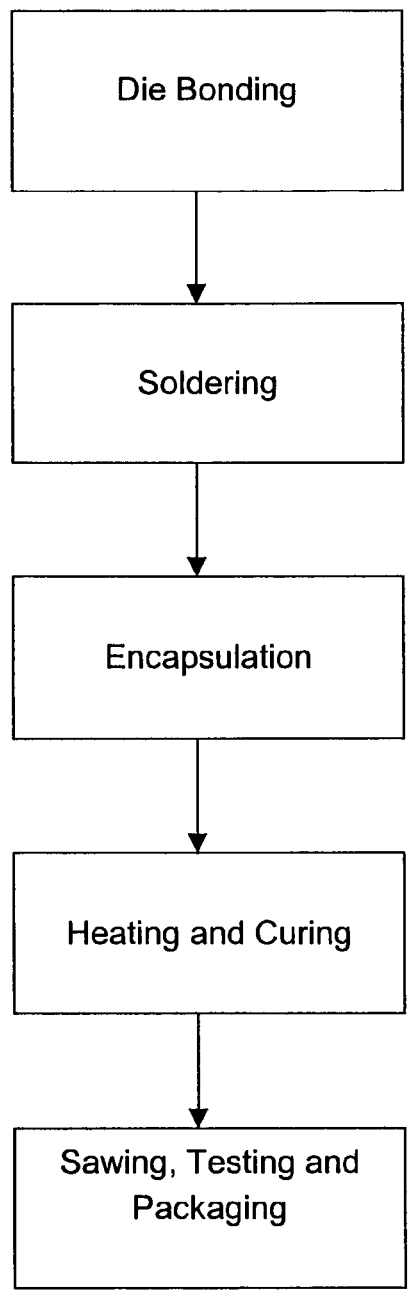
FIG. 1 shows a flow chart of a manufacturing process for a conventional light-emitting diode.
Figure 2:
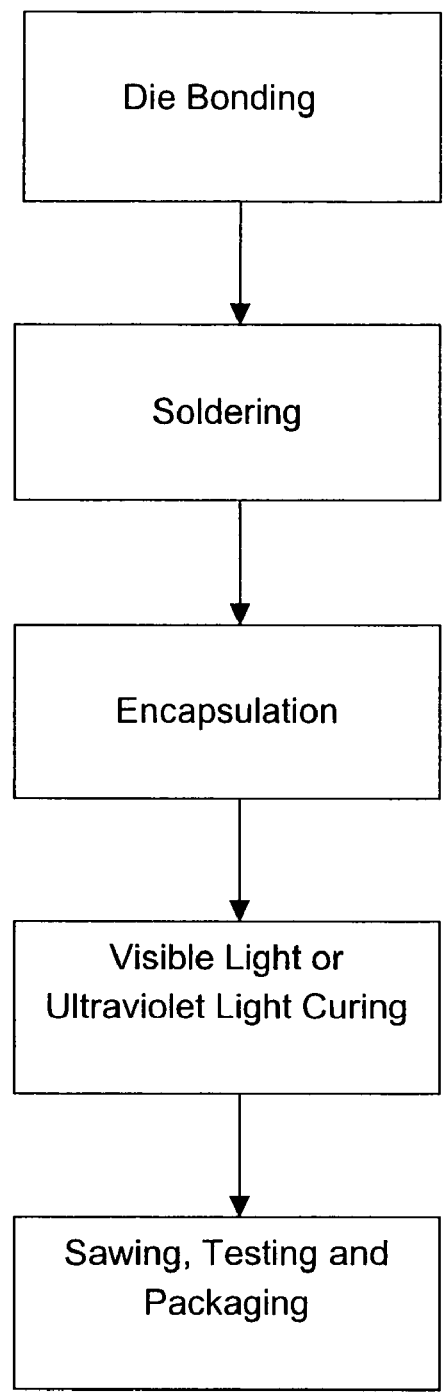
FIG. 2 shows a flow chart of a manufacturing process for a first embodiment according to the present invention.

Referring to FIG. 2, which shows encapsulation material and manufacturing process for a light-emitting diode according to the present invention, wherein an integral manufacturing process of the light-emitting diode is divided into steps as disclosed hereinafter:

1, Die Bonding: The light-emitting diode crystalline grains LED chip is placed onto a pre-punched first leadframe.

2, Soldering: A metal lead is made to connect the light-emitting diode Chip and a second lead stand thereby allowing conductance therethrough, enabling the first leadframe, a second leadframe, and the light-emitting diode chip to form an electrical link thereof.

3, Encapsulation: Upon injecting a thick, viscous, fluid photosensitive polymer into a mold, place the light-emitting diode LED chip, the first leadframe and the second leadframe into the mold.

4. Curing: Upon encapsulation, the photosensitive resin is exposed to visible light or ultraviolet light or electron beam, allowing prompt curing of the photosensitive resin thereof.

5. Cutting, testing and packaging.

In the above manufacturing process, the flow process of die bonding, soldering, encapsulation, curing and cutting, testing and packaging are all similar to prior art technology. However, the present invention is characterized in having following particular distinctive features:

The fluid form of the high molecule weight resin of the aforementioned encapsulant comprises a photo-sensitive polymer constituting at least one of an Oligomer or a reactive Monomer, and a Photoinitiator. After a LED chip encapsulation, the photo-sensitive polymer is exposed to visible light or ultraviolet light or electron beam, free of infrared rays, for around 5 to 15 seconds, thereby triggering a free radical polymerization reaction of the fluid photosensitive polymer, and rapid curing thereof under room temperature, and thus saving 3 to 8 hours spent in baking as required in the encapsulation manufacturing process of a traditional light-emitting diode, thereby achieving effectiveness of advancing enhancing production efficiency.

The present invention utilizes the aforementioned encapsulation materials to complete the manufacturing process of the light-emitting diode finished product. The inventor has made a comparison table comparing the present invention with the traditional manufacturing process, and detailed hereinafter:

The present invention utilizes the aforementioned encapsulation materials and manufacturing processes to complete the light-emitting diode finished product, while maintaining characteristics of hardness, curing speed, and resistance to ultraviolet degradation, which are clearly far superior than the light-emitting diode produced by the traditional manufacturing process as disclosed in the above comparison table. Of primary note is in the manufacturing process as disclosed in the present invention, whereby, after encapsulation, the fluid photo-sensitive polymer resin only requires exposure to visible light or ultraviolet light or Electron Beam, free of infrared rays for about 5 to 15 seconds, whereupon prompt curing occurs under room temperature. Whereas, in the traditional manufacturing process, after encapsulation, there is a requirement for placement in a heating furnace and heating at high temperature for 3 to 8 hours before curing occurs. Clearly, the present invention has achieved effectiveness in economizing on time and labor, as well as enhancing production efficiency.

Figure 3:
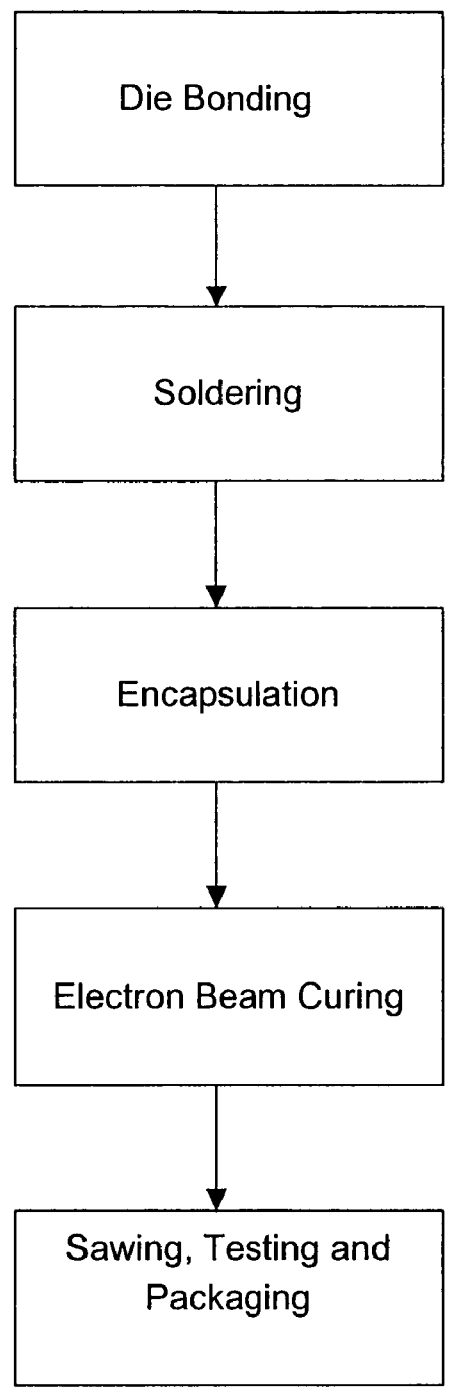
FIG. 3 shows a flow chart of a manufacturing process for a second embodiment according to the present invention.

Referring to FIG. 3, which shows a second embodiment according to the present invention, whereby an electron beam irradiation method is utilized in the manufacturing process in place of the photoinitiator agent material, and exposure to visible light only. The manufacturing process comprises a photo-sensitive polymer constituting at least one of an Oligomer or a reactive Monomer. After LED chip encapsulation, the photo-sensitive polymer is irradiated with an electron beam, whereby electron bombardment is utilized to accomplish amalgamation of material molecules, thereby triggering free radical polymerization reaction of the fluid photo-sensitive polymer, and rapid curing thereof under room temperature, eliminating the need for baking, while prompting rapid curing thereof.

Furthermore, as depicted in the drawings, the flow process of die bonding, soldering, encapsulation, and then curing, cutting, testing and packaging is similar with prior art technology, thus are not described in detail herein.

In addition, when implementing the present invention, 0.1%~20% of a Silane coupling agent may be added, thereby increasing degree of bonding strength among the materials; 0.01%~15% of ultraviolet absorber agent may be added to increase resistance to ultraviolet light degradation; 0.01%~20% of Hindered Amine Light Stabilizer may be added to avoid free radical chemical structure destruction.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the photosensitive polymer utilized in the encapsulating step c) includes an Oligomer and a Photoinitiator, wherein the photosensitive polymer utilized in the encapsulating step c) includes at least one selected from the group consisting of between 0.1% and 20% of a Silane coupling agent, 0.01% and 15% of an ultraviolet absorber agent, and between 0.01% and 20% of a Hindered Amine Light Stabilizer.

2. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the photosensitive polymer utilized in the encapsulating step c) includes a reactive Monomer and a Photoinitiator, wherein the photosensitive polymer utilized in the encapsulating step c) includes at least one selected from the group consisting of between 0.1% and 20% of a Silane coupling agent, 0.01% and 15% of an ultraviolet absorber agent, and between 0.01% and 20% of a Hindered Amine Light Stabilizer.

3. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the photosensitive polymer utilized in the encapsulating step c) includes an Oligomer, a reactive Monomer, and a Photoinitiator, wherein the photosensitive polymer utilized in the encapsulating step c) includes at least one selected from the group consisting of between 0.1% and 20% of a Silane coupling agent, 0.01% and 15 % of an ultraviolet absorber agent, and between 0.01% and 20% of a Hindered Amine Light Stabilizer.

4. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the photosensitive polymer utilized in the encapsulating step c) includes at least one selected from the group consisting of between 0.1% and 20% of a Silane coupling agent, 0.01% and 15 % of an ultraviolet absorber agent, and between 0.01% and 20% of a Hindered Amine Light Stabilizer.

5. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the curing step d) includes exposing the photosensitive polymer to a visible light, wherein the curing step d) the photosensitive polymer is exposed to the visible light for a period of time between 5 seconds and 10 seconds.

6. A method for encapsulating a light emitting diode, which comprises the steps of:
   a) placing a crystalline grains light-emitting diode chip into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chip, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode,
   wherein the curing step d) includes exposing the photosensitive polymer to an ultraviolet light, wherein the curing step d) the photosensitive polymer is exposed to the ultraviolet light for a period of time between 5 seconds and 10 seconds.

7. A method for encapsulating a light emitting diode, which comprises the steps of:
   a) placing a crystalline grains light-emitting diode chin into a pre-punched first lead frame;
   b) electrically connecting the first lead frame and the crystalline grains light-emitting diode chip to a second lead frame;
   c) encapsulating the crystalline grains light-emitting diode chip in a photosensitive polymer, the encapsulating step including placing the first lead frame, the crystalline grains light-emitting diode chin, and the second lead frame in a mold and injecting the photosensitive polymer into the mold;
   d) curing the photosensitive polymer at room temperature to form an encapsulated light emitting diode; and
   e) cutting, testing and packaging the encapsulated light emitting diode, wherein the curing step d) includes exposing the photosensitive polymer to an electron beam, wherein the curing step d) the photosensitive polymer is exposed to the electron beam for a period of time between 5 seconds and 10 seconds.

* * * * *